United States Patent

Missel

[15] 3,639,218

[45] Feb. 1, 1972

[54] SHELF LIFE IMPROVEMENT OF ELECTROPLATED SOLDER

[72] Inventor: Leo Missel, Palo Alto, Calif.

[73] Assignee: International Business Machines Corporation, Armonk, N.Y.

[22] Filed: Oct. 8, 1969

[21] Appl. No.: 864,863

[52] U.S. Cl. ....................204/40, 29/194, 204/37 T

[51] Int. Cl. ....................C23b 5/50

[58] Field of Search ....................204/37 T, 40, 43, 54 R; 29/194; 117/71

[56] References Cited

UNITED STATES PATENTS

| | | | |
|---|---|---|---|
| 3,323,938 | 6/1967 | Vaught | 29/194 |
| 2,266,330 | 12/1941 | Nachtman | 204/37 T |
| 2,734,024 | 2/1956 | Schultz | 204/40 |
| 3,445,351 | 5/1969 | Swalheim et al. | 204/37 T |

*Primary Examiner*—John H. Mack
*Assistant Examiner*—W. I. Solomon
*Attorney*—Hanifin and Jancin and William J. Kopacz

[57] ABSTRACT

The coating of electroplated solder, applied in preparation for a solder reflow operation, has a short shelf life. The shelf life can be greatly extended, without raising the melting point or detracting from the bond strength, by electroplating a layer of bright tin over the coating of electroplated solder.

1 Claims, No Drawings

SHELF LIFE IMPROVEMENT OF ELECTROPLATED SOLDER

BACKGROUND OF THE INVENTION

In the various packaging arts, solder reflow bonding techniques find wide application. The joining of an electronic circuit lead to a printed circuit board is illustrative of a solder reflow application. In order to practice the solder reflow operation, the lead or wire is first coated with a thin layer of solder. The solder is allowed to harden, and when the time comes for the mounting of the electronic circuit to the printed circuit board, the lead is placed in contact with an appropriate connection point on the printed circuit board. The solder-coated lead is then heated above the melting point of the solder causing the solder to reflow. The heat is then withdrawn from the lead and the solder hardens, thereby bonding the electronic circuit to the printed circuit board. In the above example, only the electronic circuit lead was coated with solder. However, in an actual application, the printed circuit board would be coated with a layer of solder as well.

DESCRIPTION OF PRIOR ART

The first step in a solder reflow operation, as pointed out above, is the coating of the element to be bonded with solder. The element, for example a wire, can be initially coated with solder by either of two well-known methods, namely, electroplating or thermal techniques.

Thermal application techniques, which are the most widely used methods, require that the solder be melted at some point in the layer application process. Examples of thermal layer application processes are the dipping technique and the wave technique. Dipping consists merely of dipping the material into a bath of molten solder whereby a thin coat of molten solder will adhere to its surface. The wave technique consists of passing the member through a fountain of molten solder, again causing a layer of molten solder to adhere to its surface. When the molten solder hardens, the element is ready for the solder reflow operation.

The other well-known method of applying a layer of solder to an element is the electroplating technique. The element to be plated is placed in a bath of tin-lead salts, made a cathode for a certain period of time, and then withdrawn. A layer of solder will thereby be plated on the surface of the element.

Both thermal application and electroapplication of solder enjoy certain advantages and suffer from disadvantages. For example, thermal techniques do not provide for a controlled thickness of the applied solder layer. When packaging miniature circuit elements, tolerances become critical; excess solder can easily cause short circuits. There is no way of conveniently controlling the thickness of the layer applied to an element when one is using a thermal method of solder application. Thermally applied solder suffers from the further disadvantage of collection irregularities; that is, thermally applied solder tends to collect at large areas and shrink back from smaller areas. Consider a land on a printed circuit board shaped somewhat like the profile of an hourglass. If solder is thermally applied to this land, the solder will be quite thick at the large end portions of the land and the solder would be very thin, or entirely absent, from the narrow waist portion of the land. A still further disadvantage of thermally applied solder is the "crowning" effect. The crowning effect consists of the tendency of thermally applied solder to solidify in a convex profile form on the areas in which the solder is placed. The solder, instead of lying completely flat, forms a semispherical shape over the area coated.

Electroplated solder layers do not suffer from the aforementioned disadvantages which are associated with thermally applied solder. Electroplated solder does not crown; rather, it coats the area plated with a layer of uniform thickness. Further, electroplated solder does not have a tendency to collect at large areas and shrink back from small areas. Electroplated solder coats the areas in a uniform manner, whether the areas be large or small. Further, electroplated solder is highly controllable as to thickness. Excess collections of solder on a circuit element can be easily avoided by controlling the time during which the solder is allowed to plate.

Because of the above-stated advantages of electroplated solder, when the technique of electroplating solder was first introduced about 12 years ago, there was great interest throughout the electronic packaging industry. Electroplated solder appeared to be ideally suited to the miniature circuitry in wide use in modern equipment. However, the interest in electroplated solder was short lived because of one major drawback associated with its use. Electroplated solder, unlike thermally applied solder, has an extremely short shelf life. The term "shelf life" refers to the interval between the time when the solder is initially coated onto the element and the time when the solder is reflowed during the final bonding operation. Electroplated solder remains effective in solder reflow applications for a relatively short period of time; it must be solder reflowed within about a week in order to be sure of successful bonding. After approximately a week, electroplated solder, when heated above its melting temperature, loses its wetting ability and does not form a joint. Thermally applied solder has a shelf life of a much greater extent—6 months to a year. This means that one circuit element can be manufactured in great quantities, coated with solder by thermal means, and put in storage until ready to be used. When ready to be used, the element can be quickly bound to the particular location needed by the solder reflow technique. Electroplated solder, with its shelf life of approximately a week, must be used quickly. This is a disadvantage of great magnitude in a complex manufacturing environment.

Coordination of timing as among the various circuit elements and circuit boards would be critical if one used electroplated solder. This would mean that the circuit board and all of the various and sundry circuit elements which are to be placed on the board must be coated in the same week. This is highly impractical in large, complex manufacturing schemes.

It would be highly advantageous if a technique could be devised whereby the advantages of thermally applied solder and electroplated solder could be combined, that is, if the controllability of electroplated solder could be combined with the long shelf life of thermally applied solder. Conventional solder is composed of an alloy of tin and lead, the percentages of each varying to some degree, with the eutectic composition being 63 percent tine and 37 percent lead. Investigations disclosed that tin was not unduly adversely affected by prolonged exposure to the atmosphere; the solderability or wettability of tin remained good even though the tin was exposed for long periods to the atmosphere. However, the exposure of pure lead to the atmosphere caused the lead to lose its solderability or wettability very rapidly. It would appear that, since the tin retains solderability quite well, and since the head loses solderability very rapidly, the way to increase the shelf life of solder would be to increase the proportion of tin, and decrease the proportion of lead in the solder alloy. Indeed, it would appear that the ideal case would be a "solder" of 100 percent tin. This reasoning was found to be accurate except in one important respect. As the percentage of tin in the alloy increases, so does the melting point of the alloy. An ever present problem in solder reflow applications is the high degree of heat sensitivity found in the modern miniature circuits and in the epoxy substrates of the circuit boards. A further problem found in using high percentage tin alloys, was the inferior bond strengths. Reflowed pure tin was found to form intermetallics, for example, $Cu_3Sn$ and $Cu_6Sn_5$, which intermetallics weaken the solder joints to an unacceptable degree. By increasing the percentage of tin in the alloy one tends to increase the shelf life, but in so doing, one further produces a weak solder which has a harmfully high melting point. Clearly, increased tin proportions were not the perfect answer to the problem.

From the above, it should be clear that it would be highly advantageous if one could obtain a solder coating which has all the advantages of electroplated solder (no crowning, thickness control, adhesion to small areas) together with the great advantage of thermally applied solder (long shelf life). The optimum coating, besides having these above-listed advantages, would further have to retain the relatively low melting point of conventional solder and retain the high strength of conventional solder.

SUMMARY OF THE INVENTION

Accordingly, it is an object of this invention to provide a solder coating which has a long shelf life.

It is a further object of this invention to provide a solder coating which has the advantages attendant to electroplated solder.

It is a further object of this invention to provide a solder coating of long shelf life and high controllability which forms bonds of the strength of conventional solder.

It is a further object of this invention to provide a solder coating of long shelf life and high controllability which retains the low melting point of conventional solder.

It has been discovered that the aforementioned objects and advantages can be obtained by electroplating solder of a desired composition on an element, and then plating over this electroplated solder, a coat of bright tin. It has been found that the coating of bright tin does not change the melting point of the solder layer. The electroplated layer of bright tin allows the interlayer of solder to retain its solderability for very long periods of time (for example, 2 years instead of the one week for ordinary electroplated solder).

Since, as pointed out above, pure tin has a substantially higher melting temperature than the tin-lead combinations used in ordinary solder alloys, one would not expect the solder plated with bright tin to have the same melting point as the ordinary solder composition. The fact is that the bright tin coated solder has essentially the same melting point as ordinary solder. This is because when heat is applied to the bright tin-solder combination, the solder starts to melt at its melting temperature, and when this melting begins, the thin bright tin outer layer begins to diffuse into the molten solder. The bright tin mixes with the tin-lead combination and becomes indistinguishable in the alloy. Since there is no foreign material, the combination remains tin-lead (with a slightly higher, negligible, increase in the percentage of tin in the final compositional form). There are no foreign materials; therefore, no intermetallics which can cause brittleness are formed.

DETAILED DESCRIPTION OF THE INVENTION

As has been previously pointed out, the electroplating of solder onto an element is well known. The electroplating of bright tin onto the previously electroplated layer of tin-lead can be carried out using conventional plating techniques. An example of a particularly effective method of plating the solder and tin outer coating is as follows:

The first step in a plating process is to clean the element. The element should be degreased with an alkaline cleaner and dipped in a dilute fluoboric acid solution. The cleaned element should be prepared for plating by providing the element with a strike of copper cyanide. The copper cyanide strike is an excellent base for further plating. A further acid dip into dilute fluoboric acid follows the copper striking. This acid dip removes excess copper cyanide and conditions the copper cyanide coating for adhesion.

The next step is the actual plating of the element with solder. Salts of tin and lead are dissolved in a bath. For example, tin fluoborate and lead fluoborate, fluoboric acid and peptone are dissolved in water. The percentages, by weight, of tin and lead are selected to plate a 60–40 solder. Next the element to be solder plated is made a cathode. Current is passed through the element at the rate of, for example, 30 amps per square foot (assuming room temperature).

After plating, the now solder-coated element is removed from the solder bath and rinsed with water. The element is then prepared for the tin plating by an acid dip to clean any remaining contamination. A bath is prepared consisting of stannous sulphate, sulfuric acid, and bright tin additives. Bright tin will produce a bright, smooth, essentially nonporous surface. Next, the solder-coated element is dipped in the bright tin bath and made a cathode. Thirty amps are pulsed through the element for 30 seconds, and the remaining plating is accomplished at 15 amps per square foot. The 30 amp surge is found advantageous to efficient plating.

The element is removed, rinsed with water, and ready for any further processing desired. By use of the aforedescribed process, a highly controllable solder coating with an extremely long shelf life is produced.

While the invention has been particularly shown and described with reference to a preferred embodiment thereof, it will be understood by those skilled in the art that various changes in the form and details may be made therein without departing from the spirit and scope of the invention.

What is claimed is:

1. A method of coating a member in order that the member be solder reflow bondable comprising:
   electroplating a layer of solder onto the surface of said member; and
   electroplating a layer of bright tin over said layer of solder.

* * * * *